United States Patent
Hayashi et al.

(10) Patent No.: US 7,266,036 B2
(45) Date of Patent: Sep. 4, 2007

(54) SEMICONDUCTOR MEMORY DEVICE

(75) Inventors: Emi Hayashi, Kyoto (JP); Kiyoto Ohta, Osaka (JP); Yuji Yamasaki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 165 days.

(21) Appl. No.: 10/860,111

(22) Filed: Jun. 4, 2004

(65) Prior Publication Data

US 2004/0264259 A1 Dec. 30, 2004

(30) Foreign Application Priority Data

Jun. 24, 2003 (JP) ............... 2003-178938

(51) Int. Cl.
*G11C 8/00* (2006.01)
(52) U.S. Cl. ............ 365/230.03; 365/205; 365/196; 365/231
(58) Field of Classification Search ........... 365/230.03
See application file for complete search history.

(56) References Cited

U.S. PATENT DOCUMENTS

| | | | | |
|---|---|---|---|---|
| 5,226,011 | A | * | 7/1993 | Yanagisawa ............ 365/189.05 |
| 5,680,363 | A | * | 10/1997 | Dosaka et al. ......... 365/230.03 |
| 5,748,556 | A | * | 5/1998 | Iyengar ................. 365/230.06 |
| 6,144,616 | A | * | 11/2000 | Suzuki et al. ............... 365/233 |
| 6,310,596 | B1 | * | 10/2001 | Takasugi ..................... 345/98 |

2002/0141264 A1 10/2002 Mori et al.

FOREIGN PATENT DOCUMENTS

| JP | 56-019595 | 2/1981 |
|---|---|---|
| JP | 05-258591 | 10/1993 |
| JP | 09-306170 | 11/1997 |
| JP | 2002-056693 | 2/2002 |
| JP | 2002-150800 | 5/2002 |
| JP | P2002-298596 A | 10/2002 |

OTHER PUBLICATIONS

Jan. 26, 2007 JP OA and English Translation (8 pp.).
Japanese Office Action dated May 22, 2007 (with English Translation).

* cited by examiner

*Primary Examiner*—Thong Q. Le
(74) *Attorney, Agent, or Firm*—McDermott Will & Emery LLP (57) ABSTRACT

A semiconductor memory device is provided with a plurality of memory blocks including a plurality of word lines and a plurality of bit line pairs intersecting the individual word lines, a plurality of memory cells provided at each of intersections where the individual word lines intersect the bit line pairs, and a plurality of sense amplifiers respectively provided in correspondence with the bit line pairs. The semiconductor memory device further comprises common data bus line pairs each connected via switch transistors to the corresponding memory blocks, a read/write amplifier for performing a data read/write operation through the common data bus line pairs on the memory blocks, and an SRAM cell electrically connected via switch transistors to each common data bus line pair.

17 Claims, 5 Drawing Sheets

SEMICONDUCTOR MEMORY DEVICE

BACKGROUND OF THE INVENTION (1) Field of the Invention

The present invention relates to a semiconductor memory device comprising a dynamic random access memory (DRAM).

(2) Description of Related Art

In dynamic random access memories (hereinafter, referred to as DRAMs) having a relatively large storage capacity, there have been typically used so-called redundancy repair techniques in which when a defect occurs in a memory cell during their manufacturing process, the defect is repaired by replacing a defective cell with a previously prepared spare memory cell. In this way, defects due to the manufacturing process are repaired, leading to improved yields.

The redundancy repair techniques have various schemes. In particular, the following three schemes have conventionally been employed.

The first scheme is a line-based redundancy scheme in which lines such as spare rows (word lines) and columns (bit lines or data lines) are provided and a row or column line including a defective memory cell is replaced with a spare line;

the second scheme is a block redundancy scheme in which one or more spare memory cells are prepared for each unit of arbitrary number of memory blocks and a defective cell is replaced with a spare cell in the corresponding unit of memory blocks; and the third scheme is a bit redundancy scheme in which a defective bit is replaced with a spare bit on a bit-by-bit basis.

Out of these schemes, the line-based repair scheme that is the first repair scheme is most superior and has been actually and widely used in view of the following: an increase in the circuit area caused by the placement of spare memory cells, the flexibility for repairs, repairs against a few bit defects, for example, taking place in a process step for forming a diffusion layer or a process step for forming a cell or against line defects, for example, taking place in a process step for forming a metal interconnect, and further the complexity of a control circuit itself for controlling redundancy repairs.

(First Known Example)

A row redundancy scheme that is a kind of line-based redundancy scheme will be described hereinafter as a first known example. The row redundancy scheme is a scheme for performing a redundancy repair by replacing a defective word line with a spare word line.

Figure 5:
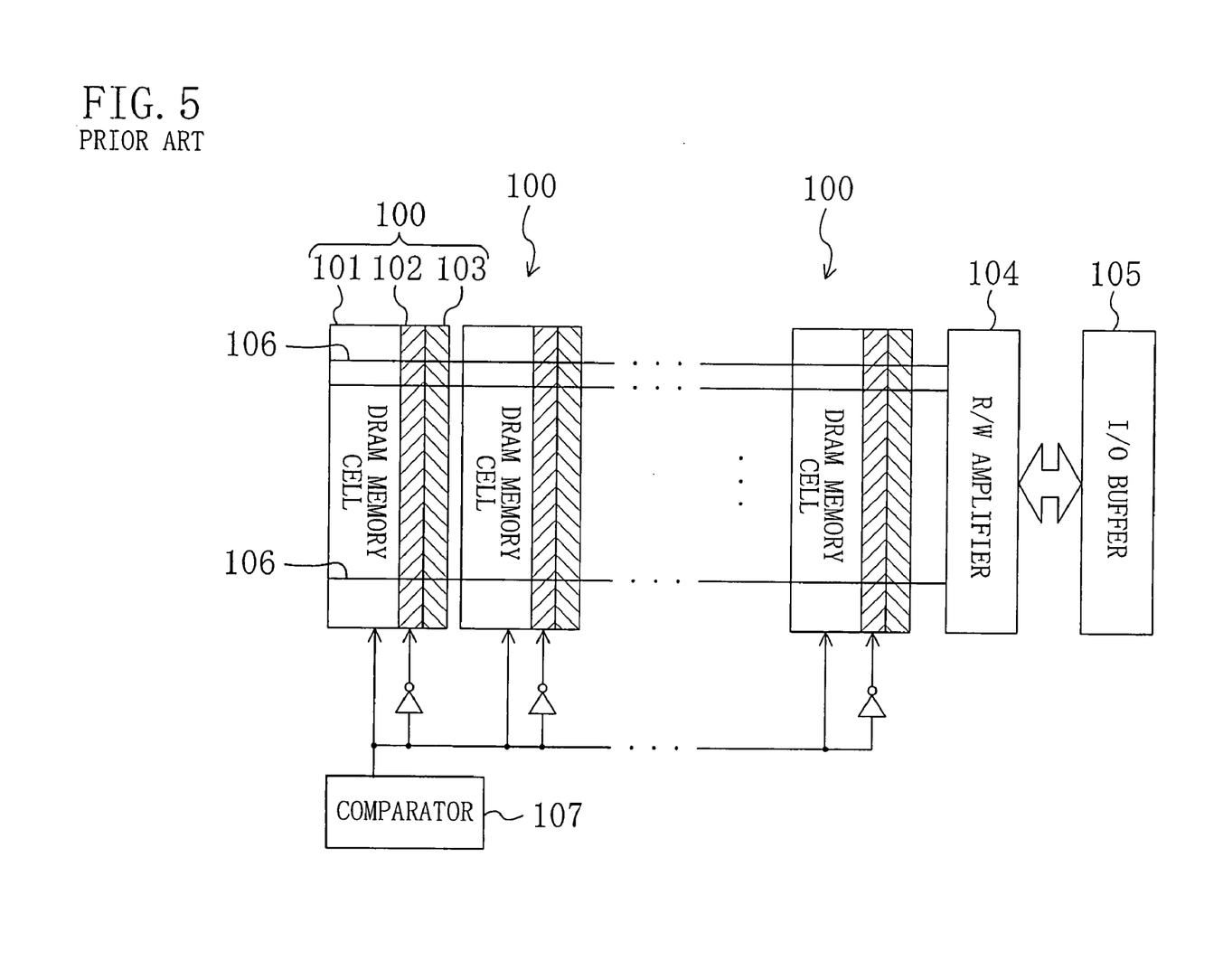
FIG. 5 is a block diagram showing a DRAM device employing a row redundancy scheme according to a first known example.

FIG. 5 shows the first known example, i.e., the block structure of a DRAM device employing a row redundancy scheme.

As shown in FIG. 5, the known DRAM device comprises a plurality of memory blocks 100 each consisting of a memory cell array 101, a redundancy word line 102 and a sense amplifier array 103, a read/write (R/W) amplifier 104 for reading/writing data from/to each memory cell array 101, a data input/output (I/O) buffer 105 for externally inputting/outputting data, and a comparator 107 for comparing an externally input address with a previously detected defective address.

The sense amplifier array 103 in each memory block 100 is electrically connected via a plurality of common data bus lines 106 to the read/write amplifier 104.

The comparator 107 receives an input address and a defective address. In the comparator 107, if the input address coincides with the defective address, the redundancy word line 102 in the particular memory block 100 is selected. If not, a word line belonging to the memory cell array 101 is selected.

Such an above technique in which one redundancy word line 102 is provided in each memory block 100 increases the number of redundancy word lines 102 with the increasing number of blocks. This increases the circuit area.

Furthermore, in order to achieve increase in processing speed and reduction in power, a method is effective in which the memory block 100 is divided into smaller units to reduce the number of memory cells per unit block. However, also in this case, the provision of a redundancy word line 102 in each memory block 100 increases the circuit area, thus leading to increased demerits.

An alternative method is to provide redundancy memory blocks, instead of the provision of a redundancy word line 102 in each memory block 100. In this case, however, the circuit area increases by the area of sense amplifiers because a sense amplifier is essential for DRAM cells.

(Second Known Example)

Next, a DRAM device employing a bit redundancy system is given as a second known example (see, for example, Japanese Unexamined Patent Publication No. 2002-298596). According to this publication, the regions of a sense amplifier array placed in each memory block and row and column decoders are partly employed as SRAM redundancy cells, and defective cells are replaced on a cell-by-cell basis.

In the redundancy repair technique for a DRAM device according to the first known example, the provision of a redundancy word line 102 in each memory block 100 significantly increases the circuit area, resulting in reduced repair efficiency.

The redundancy repair technique for a DRAM device according to the second known example is a bit redundancy scheme, and therefore cannot repair line defects. Furthermore, in this scheme, it becomes more difficult to reserve space to place SRAM cells in the regions shown in the above publication as the process geometry becomes finer. In addition, when the processes have matured, the method of placing redundancy SRAM cells in each memory block must provide low repair efficiency.

SUMMARY OF THE INVENTION

The present invention is made in view of the above conventional problems, and its object is to provide a redundancy repair scheme with excellent repair efficiency while restraining the circuit area from increasing due to redundancy cells.

In order to attain the above object, the present invention provides a semiconductor memory device in which a latch circuit that can hold data is connected via selection switches to common data bus line sets shared by a plurality of memory blocks.

More specifically, a semiconductor memory device comprises: a plurality of memory blocks including a plurality of word lines and a plurality of bit line pairs intersecting the individual word lines, a plurality of memory cells provided at each of intersections where the individual word lines intersect the individual bit line pairs, and a plurality of sense amplifiers respectively provided in correspondence with the plurality of bit line pairs; a plurality of common data bus line sets each electrically connected via first selection switches to the corresponding memory blocks; at least one latch circuit electrically connected via second selection switches to each of the common data bus line sets.

According to the semiconductor memory device of the present invention, a defective word line taking place in the memory block and memory cells accessed via the word line can be replaced with the latch circuit. This can suppress the increase in the circuit area as compared with the structure of the conventional semiconductor memory device in which one or more spare cells (redundancy cells) are placed in each memory block and the structure of the conventional semiconductor memory device in which a redundancy block including redundancy DRAM cells is placed. Furthermore, since the latch circuit is shared by the common data bus line sets, the memory cell can be replaced with the latch circuit even when the defective word line takes place in any memory block, resulting in improved repair efficiency.

In the semiconductor memory device of the present invention, the latch circuit is preferably an SRAM circuit. Thus, an SRAM cell of the same process generation as the DRAM can be used. Therefore, it becomes possible to reduce the circuit area and reduce man-hours for layout.

In the semiconductor memory device of the present invention, the number of the latch circuits is preferably the same as that of the sense amplifiers activated during one cycle of access to each said memory block. Thus, data corresponding to one row (bit line) can be stored in the latch circuit.

In the semiconductor memory device of the present invention, the number of the latch circuits is preferably the same as that of the common data bus line sets. This also allows data corresponding to one row (bit line) to be stored in the latch circuit.

In the semiconductor memory device of the present invention, the latch circuit is preferably arranged in the same layout pattern as each said sense amplifier. Thus, the layout pattern of the sense amplifier in each memory block can also be used in the layout of the latch circuit. This improves the layout efficiency of the latch circuit.

Preferably, the semiconductor memory device of the present invention further comprises a read/write amplifier for performing a data read/write operation through the common data bus line sets on the plurality of memory blocks, wherein the at least one latch circuit is placed between the memory blocks and the read/write amplifier. Thus, the latch circuit is placed in the vicinity of the read/write amplifier. This allows high-speed access to the latch circuit.

In the semiconductor memory device of the present invention, it is preferable that the plurality of bit line pairs, the plurality of word lines and the plurality of common data bus line sets have a multilayer interconnect structure consisting of at least three layers. The use of such a multilayer interconnect structure can certainly reduce the chip area.

Preferably, the semiconductor memory device of the present invention further comprises at least one comparator for comparing a value of an externally input external address to a value of a previously programmed program address, wherein when the at least one comparator compares, in its activated state, the value of the external address to the value of the program address and both the values coincide with each other, the latch circuit is selected instead of the sense amplifier corresponding to the external address. This allows the latch circuit to be certainly replaced as a redundancy circuit.

In this case, preferably, the semiconductor memory device of the present invention further comprises a decoder circuit for decoding the external address in parallel with the comparison of the external address to the program address, wherein the comparator completes the comparison before the sense amplifier corresponding to the external address or the latch circuit is selected. Thus, even when the latch circuit is selected as a redundancy cell array, it becomes possible to make high-speed access.

When the semiconductor memory device includes the at least one comparator, the word line designated by the external address in the memory block and the corresponding sense amplifier are preferably activated independently of a comparison result output from the comparator. Thus, even when the latch circuit is selected by the program address, high-speed read and write operations become possible.

Furthermore, when the semiconductor memory device includes the at least one comparator, it is preferable that the word line designated by the external address in the memory block is activated independently of a comparison result output from the comparator and the sense amplifier designated by the external address is not activated when the comparison result output from the comparator is true. Thus, when the latch circuit is selected by the program address, the sense amplifier designated by the external address is not activated. Therefore, power consumption due to a sensing operation can be reduced.

Furthermore, when the semiconductor memory device includes the at least one comparator, preferably, the semiconductor memory device of the present invention further comprises: an internal address generation circuit for generating an internal address for a refresh operation of refreshing data held by the plurality of memory cells; and a selection circuit for selecting, during a refresh operation, the word line corresponding to a refresh address generated by the internal address generation circuit, wherein during the refresh operation, the latch circuit is not selected independently of the comparison result between the refresh address and the program address. Thus, even when the latch circuit can be replaced as a redundancy circuit, a refresh operation can be performed without any trouble.

In this case, it is preferable that when a coincidence is obtained as the comparison result between the refresh address and the program address, the sense amplifier designated by the refresh address in the memory block is not activated. This can reduce power consumption due to a sensing operation during a refresh.

Furthermore, when the semiconductor memory device includes the at least one comparator, the program address is preferably programmed by fuse elements. Thus, the fuse elements are physically disconnected, thereby easily and certainly generating the program address.

When the semiconductor memory device includes the at least one comparator, the program address is preferably programmed by nonvolatile memory elements. Thus, the program address can electrically be generated. This can also simplify the manufacturing process as compared with a physical program.

When the semiconductor memory device includes the at least one comparator, it is preferable that when a first switching signal is activated, the sense amplifier corresponding to the external address is not selected independently of the comparison result output from the comparator and the latch circuit is forcedly selected. Thus, it becomes possible to previously examine whether or not a redundancy cell itself constituting the latch circuit is defective.

When the semiconductor memory device includes the at least one comparator, it is preferable that when a second switching signal is activated, the latch circuit is not selected independently of the comparison result output from the comparator and the sense amplifier corresponding to the external address is forcedly selected. Thus, an address program can be restored to its state before programmed. This helps defect analysis in the manufacturing process, in particular, when the physical program is employed.

DETAILED DESCRIPTION OF THE INVENTION (Embodiment 1)

A first embodiment of the present invention will be described hereinafter with reference to the drawings.

Figure 1:
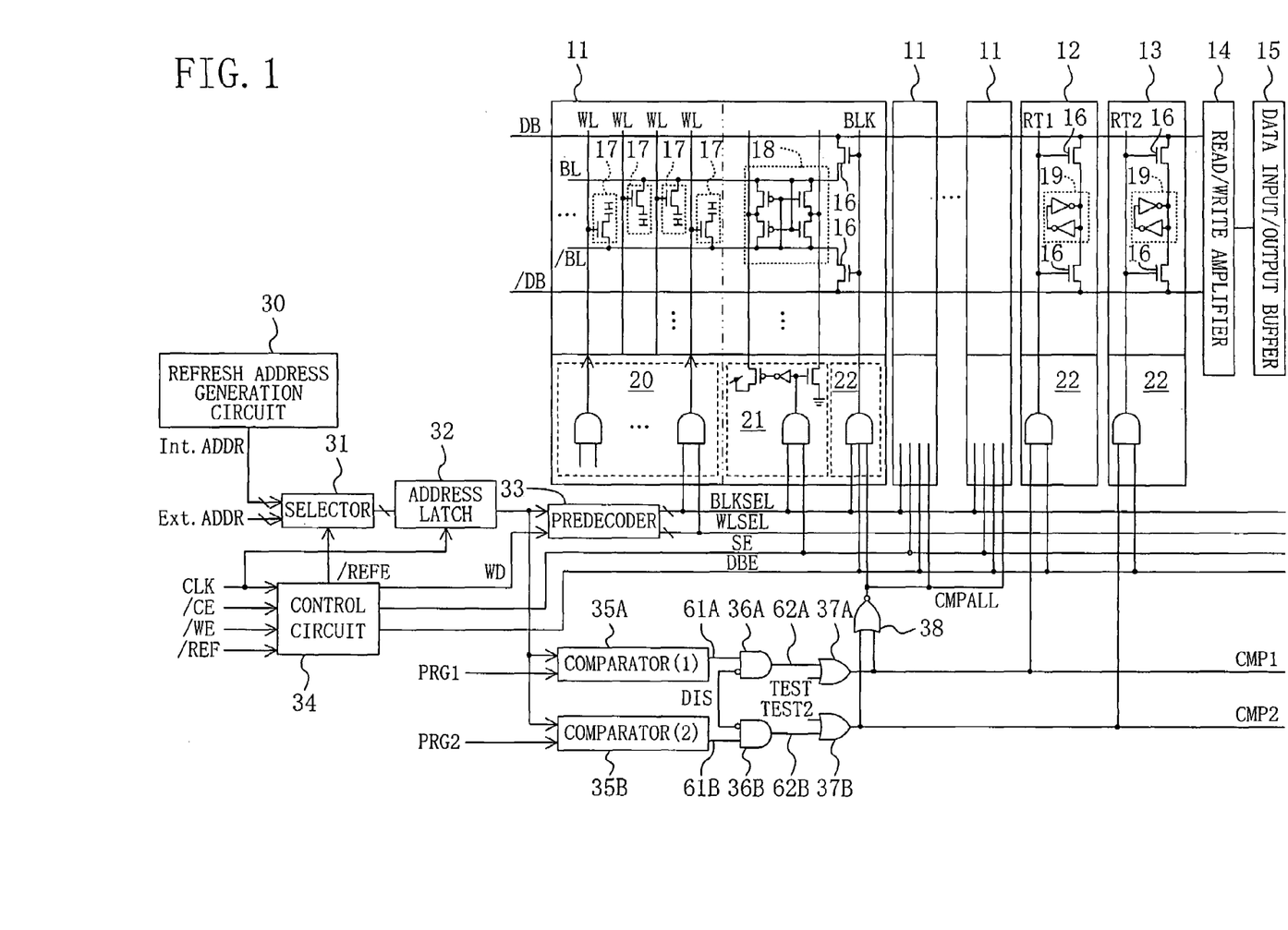
FIG. 1 is a block diagram showing a semiconductor memory device according to a first embodiment of the present invention.

FIG. 1 shows the block structure of a semiconductor memory device according to a first embodiment of the present invention.

As shown in FIG. 1, a semiconductor memory device according to the first embodiment comprises a plurality of memory blocks 11, first and second latch blocks 12 and 13 for redundancy repair, a read/write amplifier 14 for reading/writing data from/to each memory block 11, and a data input/output buffer 15 for controlling data input and output. They are placed along the column direction.

The read/write amplifier 14 is electrically connected to each memory block 11, the first and second latch blocks 12 and 13 via a common data bus line pair DB and /DB with a switch transistor 16 interposed between each block and each common data bus line.

Each memory block 11 is provided with a plurality of bit line pairs BL and /BL extending in the same direction as the common data bus line pair DB and /DB and a plurality of word lines WL extending in the direction intersecting each bit line pair BL and /BL, i.e., in the row direction.

A memory cell 17 is provided for each of intersections where the individual word lines WL intersect the individual bit line pairs BL and /BL. Each memory cell 17 is composed of a selection transistor whose gate is connected to the word line WL, and a capacitor to which external access is controlled by the selection transistor.

A sense amplifier 18 is connected to one end of the bit line pair BL and /BL in the memory block 11. The sense amplifier 18 consists of two p-type transistors in series and two n-type transistors in series. One of the p-type transistors and one of the n-type transistors are both connected at their sources to the bit line BL and connected at their gates to the complementary bit line /BL. The other of the p-type transistors and the other of the n-type transistors are both connected at their sources to the complementary bit line /BL and connected at their gates to the bit line BL.

Each of the first and second latch blocks 12 and 13 includes an SRAM (static random access memory) cell 19 as a latch circuit in which two inverter circuits are connected in flip-flop form. In this case, the SRAM circuit 19 is preferably placed in the same layout pattern as each sense amplifier 18.

A row decoder 20, a sense amplifier activation control circuit 21 and a data bus line connection control circuit 22 are connected to each memory block 11. The row decoder 20 consists of a plurality of AND circuits and selectively activates each word line WL. The sense amplifier activation control circuit 21 activates the sense amplifier 18. The data bus line connection control circuit 22 consists of an AND circuit connected via a block selection line BLK and the switch transistors 16 to the common data bus line pair DB and /DB.

Like each memory block 11, each of the first and second latch blocks 12 and 13 is also provided with a data bus line connection control circuit 22. Each data bus line connection control circuit 22 is connected at its output terminal to the common data bus line pair DB and /DB via a first selection line RT1 or a second selection line RT2 and the switch transistors 16.

The sense amplifier activation control circuit 21 is composed of an n-type transistor and a p-type transistor. The drain of the n-type transistor is connected to the drains of the two n-type transistors constituting a part of the sense amplifier 18, the source thereof is grounded, and the gate thereof receives the output of the AND circuit. The drain of the p-type transistor is connected to the drains of the two p-type transistors constituting a part of the sense amplifier 18, the source thereof is connected to a power source, and the gate thereof receives the output of the AND circuit through an inverter circuit.

A description will be given below of control circuitry relating to address control and operation timing control.

The control circuitry includes a refresh address generation circuit 30, a selector 31, an address latch circuit 32, a predecoder 33, a control circuit 34, a first comparator 35A, and a second comparator 35B. The refresh address generation circuit 30 generates an internal address signal Int.ADDR for each memory cell necessary during a refresh operation and outputs the generated internal address signal Int.ADDR. The selector 31 selects and outputs either of an internal address signal Int.ADDR and an externally input external address signal Ext.ADDR. The address latch circuit 32 latches the selected address signal. The predecoder 33 predecodes the latched address signal. The control circuit 34 delivers different control signals to the selector 31, the predecoder 33, each sense amplifier activation control circuit 21 and each data bus line connection control circuit 22, respectively. The first comparator 35A compares a previously detected and programmed first program address signal PRG1 representing a redundancy repair address for use in repairing a defective word line to an address signal from the address latch circuit 32, and outputs the comparison result. The second comparator 35B compares a previously detected and programmed second program address signal PRG2, like the first program address signal PRG1, to the address signal from the address latch circuit 32 and outputs the comparison result.

The control circuit 34 receives an externally input clock signal CLK for controlling the operation timing, a chip enable signal /CE for switching the operation mode, a write enable signal /WE for enabling the write operation, and a refresh signal /REF for refreshing each memory cell 17. The control circuit 34 delivers, to the selector 31, an internal refresh signal /REFE for allowing the selector 31 to switch from an internal address signal Int.ADDR to an external address signal Ext.ADDR or vice versa. Furthermore, the control circuit 34 delivers a word line drive timing signal WD, a sense enable signal SE and a data bus line enable signal DBE to the predecoder 33, each sense amplifier activation control circuit 21 and each data bus line connection control circuit 22, respectively.

In this relation, "/" given to a representation of a signal name, like the chip enable signal /CE, represents that such a signal is a so-called low active signal that is significant at LOW level.

The predecoder 33 delivers a block selection signal BLKSEL for selecting one of the memory blocks 11 to the corresponding row decoder 20, sense amplifier activation control circuit 21 and data bus line connection control circuit 22, and further delivers a word line selection signal WLSEL for selecting one of the word lines WL to the row decoder 20.

The first comparator 35A compares the first program address signal PRG1 to the address signal from the address latch circuit 32 and outputs the comparison result as a coincidence detection result signal 61A. The output coincidence detection result signal 61A is fed into a positive phase input terminal of a first switch circuit 36A consisting of an AND circuit with a negative phase input terminal.

A switching reset signal DIS is fed into the negative phase input terminal of the first switch circuit 36A. When the switching reset signal DIS is at HIGH level, a low-level coincidence detection result signal 62A is always output.

A first TEST circuit 37A consisting of an OR circuit receives the coincidence detection result signal 62A at one input terminal and receives a first switching signal TEST at the other input terminal. A first repair signal CMP1 is delivered as an output of the first TEST circuit 37A to the data bus line connection control circuit 22 of the first latch block 12.

Likewise, the second comparator 35B compares the second program address signal PRG2 to the address signal from the address latch circuit 32 and outputs the comparison result as a coincidence detection result signal 61B. The coincidence detection result signal 61B is fed to a second switching circuit 36B, a coincidence detection result signal 62B from the second switching circuit 36B is received by a second TEST circuit 37B, and a second repair signal CMP2 is delivered as an output of the second TEST circuit 37B to the data bus line connection control circuit 22 of the second latch block 13.

The control circuitry further includes a conversion circuit 38 consisting of a NOR circuit. When the first and second repair signals CMP1 and CMP2 are both at LOW level, the NOR circuit generates a high-level non-repair signal CMPALL, and delivers the generated signal to the data bus line connection control circuit 22 of each memory block 11 to connect each memory block 11 to the common data bus pair DB and /DB without connecting the first and second latch blocks 12 and 13 thereto.

Subsequently, a description will be given of a selection operation of selecting one word line WL at the time of reading and writing of data.

First, since the operation mode in this case is not a refresh mode, a refresh signal /REF in an inactive state at HIGH level is fed into the control circuit 34. Therefore, the control circuit 34 also delivers, to the selector 31, an internal refresh signal /REFE in an inactive state at HIGH level. The selector 31 having received this inactive internal refresh signal /REFE selects one of parallel input external address signals Ext.ADDR and feeds the selected address signal via the address latch circuit 32 to the predecoder 33.

Next, the predecoder 33 having received the external address signal Ext.ADDR and a word line drive timing signal WD delivers parallel block selection signals BLKSEL to the row decoders 20, sense amplifier activation control circuits 21 and data bus line connection control circuits 22, respectively. The predecoder 33 further delivers parallel word line selection signals WLSEL to the row decoders 20, respectively.

Each row decoder 20 decodes the input block selection signal BLKSEL and word line selection signal WLSEL so that one designated word line WL is selected from among the word lines WL in the plurality of memory blocks 11. Simultaneously, the sense amplifier activation control circuit 21 activates the sense amplifier 18 according to the high-level block selection signal BLKSEL from the predecoder 33 and a high-level sense enable signal SE from the control circuit 34.

The first comparator 35A receives the external address signal Ext.ADDR output from the address latch circuit 32 and a previously prepared first program address signal PRG1 for redundancy repair and makes comparison between them. The first comparator 35A outputs a coincidence detection signal 61A that is at LOW level when both the signals do not coincide with each other or at HIGH level when they coincide with each other.

The first switch circuit 36A having received the coincidence detection signal 61A outputs a coincidence detection signal 62A with the level of the input coincidence detection signal 61A kept when the switching reset signal DIS is inactive at LOW level.

Then, the first TEST circuit 37A receives the coincidence detection signal 62A. When the level of the first switching signal TEST is inactive at LOW level, the first TEST circuit 37A outputs the input coincidence detection signal 62A as a first repair signal CMP1 while keeping its level. The similar operation is also carried out for the second comparator 35B.

In this relation, for example, when the first repair signal CMP1 and the second repair signal CMP2 are both at LOW level, i.e., when the external address signal Ext.ADDR coincides with neither of the first and second program address signals PRG1 and PRG2, the non-repair signal CMPALL output from the conversion circuit 38 is turned HIGH. Then, the potential of the block selection line BLK is controlled by the combination of both the block selection signal BLKSEL output from the predecoder 33 and the data bus line enable signal DBE output from the control circuit 34. Thus, when the block selection signal BLKSEL and the data bus line enable signal DBE are both at HIGH level, the block selection line BLK transitions to HIGH level so that the switch transistors 16 turn on. Hence, the corresponding memory block 11 is electrically connected to the common data bus line pair DB and /DB. In this case, since the first and second selection lines RT1 and RT2 are both at LOW level, both the first and second latch blocks 12 and 13 are not electrically connected to the common data bus line pair DB and /DB.

On the other hand, for example, when the coincidence detection result signal 61A from the first comparator 35A is at HIGH level, i.e., when the external address signal Ext.ADDR coincides with the first program address signal PRG1, the first repair signal CMP1 is at HIGH level. Therefore, when the first repair signal CMP1 is fed into the data bus line connection control circuit 22 of the first latch block 12, the first selection line RT1 transitions to HIGH level because of the data bus line enable signal DBE and the first repair signal CMP1 both at HIGH level so that the switch transistors 16 turn on. Hence, the first latch block 12 is electrically connected to the common data bus line pair DB and /DB. When the coincidence detection result signal 61B from the second comparator 35B is at HIGH level, the second latch block 13 is electrically connected to the common data bus line pair DB and /DB. In these cases, the non-repair signal CMPALL output from the conversion circuit 38 is at LOW level. Thus, the block selection line BLK of each memory block 11 is also at LOW level. As a result, none of the memory blocks 11 is electrically connected to the common data bus line pair DB and /DB.

When the switching reset signal DIS is turned HIGH and activated, the coincidence detection result signals 62A and 62B from the first and second switch circuits 36A and 36B are at LOW level independently of the values of the coincidence detection result signals 61A and 61B from the first and second comparators 35A and 35B. Therefore, the first and second repair signals CMP1 and CMP2 from the first and second TEST circuits 37A and 37B are at LOW level and the non-repair signal CMPALL is at HIGH level. Thus, each memory block 11 is forcedly connected to the common data bus line pair DB and /DB. With this structure, the state of the program for each program address signal PRG1, PRG2 can be restored to its initial state before programmed. This helps analysis of defects due to the manufacturing process, in particular, when a physical program is employed.

Furthermore, when the first switching signal TEST, which is to be fed into the first TEST circuit 37A, is turned HIGH and activated, the first repair signal CMP1 from the first TEST circuit 37A is turned HIGH independently of the value of the coincidence detection result signal 61A from the first comparator 35A. As a result, the first latch block 12 is forcedly connected to the common data bus line pair DB and /DB. Likewise, when the second switching signal TEST2, which is to be fed into the second TEST circuit 37B, is set at HIGH level, the second latch block 13 is forcedly connected to the common data bus line pair DB and /DB independently of the value of the coincidence detection result signal 61B from the second comparator 35B. This structure makes it possible to previously examine whether or not the SRAM circuit 19 itself for redundancy repair is defective.

As described above, the semiconductor memory device according to the first embodiment can switch from the word line WL designated by the external address signal Ext.ADDR to the first or second selection line RT1 or RT2 designated by the first or second program address signal PRG1 or PRG2. Therefore, when the addresses of defective word lines are previously set as the first and second program addresses PRG1 and PRG2, the defective word lines can be repaired through the row redundancy scheme.

Although in the first embodiment there are provided two comparators, i.e., the first and second comparators 35A and 35B, this is not restrictive. There may be provided one or three or more comparators.

Furthermore, although not shown, the address setting for specifying the defective word lines is physically programmable using fuse elements or electrically programmable using nonvolatile memory cells.

In addition, it is preferable that the semiconductor memory device of the first embodiment has a multilayer interconnect structure consisting of an interconnect layer including a plurality of bit line pairs BL and /BL, an interconnect layer including a plurality of word lines WL and an interconnect layer including a plurality of common data bus lines DB and /DB.

(Read Operation)

The timing of the read operation of the semiconductor memory device according to the first embodiment will be described hereinafter with reference to FIGS. 1 and 2.

Figure 2:
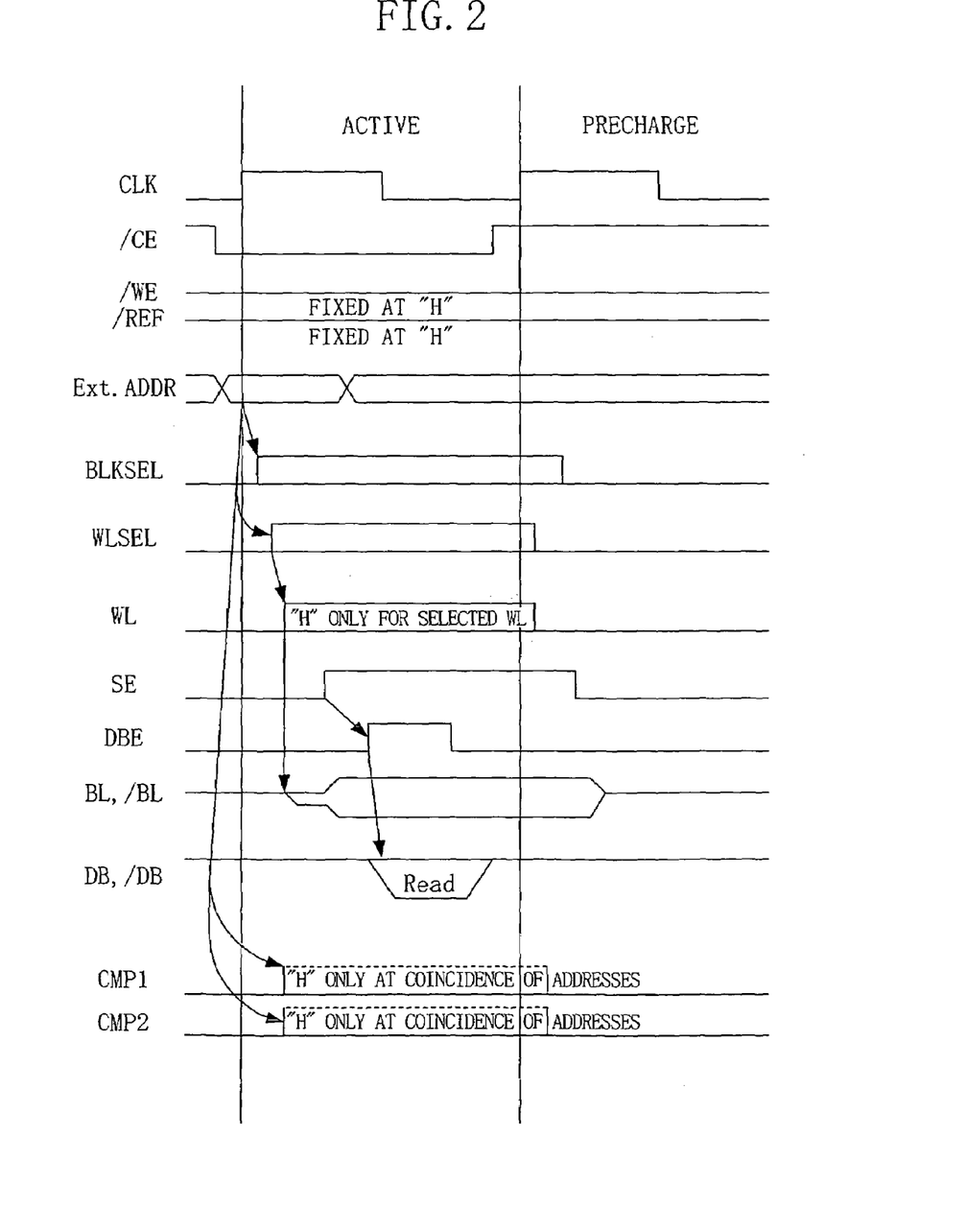
FIG. 2 is a timing diagram showing the timing of a read operation of the semiconductor memory device according to the first embodiment of the present invention.

FIG. 2 is a timing chart during the read operation of the semiconductor memory device.

First, as shown in FIG. 2, the chip enable signal /CE is activated at LOW level and fed into the control circuit 34. Thus, each memory block 11 and its peripheral circuits become activated. In this case, the write enable signal /WE for enabling the write operation and the refresh signal /REF are fixed to an inactive state at HIGH level.

Thereafter, the decoding of the external address signal Ext.ADDR is started on the rising edge of the clock signal CLK.

When the predecoder 33 decodes the external address signal Ext.ADDR, the potentials of the block selection signal BLKSEL and word line selection signal WLSEL for the memory block 11 corresponding to the external address signal Ext.ADDR are turned HIGH. Thus, the selected word line WL transitions to HIGH level.

Simultaneously, the comparators 35A and 35B start comparisons of the external address signal Ext.ADDR to program address signals PRG1 and PRG2, respectively. When a coincidence is obtained as the comparison result, the potential of the first or second repair signal CMP1 or CMP2 rises. On the other hand, when no coincidence is obtained as the comparison result, the repair signals CMP1 and CMP2 are turned LOW and inactivated. Thus, the output signal from the conversion circuit 38 is turned HIGH and activated.

Thereafter, the increased potential of the designated word line WL increases the potential of the sense enable signal SE from the control circuit 34. Since not only the block selection signal BLKSEL but also the sense enable signal SE transition to HIGH level, the corresponding sense amplifier 18 is activated. Furthermore, the increased potential of the designated word line WL allows the selection transistor of the memory cell 17 to be in a low impedance state. This gradually increases the potential difference between the bit line pair BL and /BL connected to the selection transistor. As a result, data (charge) of the designated memory cell 17 is stored in the drains of the switch transistors 16 by the activated sense amplifier 18 connected to the bit line pair BL and /BL.

After the potential of the sense enable signal SE rises to HIGH level, the potential of the data bus line enable signal DBE output from the control circuit 34 also rises. The block selection signal BLKSEL and the repair signals CMP1 and CMP2 have transitioned to a predetermined potential by this stage. Therefore, the selection of the word line WL designated by the external address signal Ext.ADDR or the selection line RT1 or RT2 has completed.

Therefore, according to the semiconductor memory device of the first embodiment, when the word line WL is selected, the switch transistors 16 for opening/closing between the bit line pair BL and /BL and the common data bus line pair DB and /DB turn on in accordance with the data bus line connection control circuit 22. Immediately thereafter, the data stored in the drains of the switch transistors 16 is read out onto the common data bus line pair DB and /DB. The read data is delivered through the read/write amplifier 14 to the data input/output buffer 15.

On the other hand, for example, when the first repair signal CMP1 is turned HIGH and the first selection line RT1 is thus selected, the switch transistors 16 placed in the first latch block 12 turn on. Thus, the data held by the latch circuit 19 are determined without being sensed and are delivered through the common data bus line pair DB and /DB and the read/write amplifier 14 to the data input/output buffer 15.

In this way, the semiconductor memory device according to the first embodiment carries out in the data read operation, parallel processing of selection of a word line WL by the predecoder 33 and comparisons of the comparators 35A and 35B for detecting a redundancy repair address specifying a defective word line. Therefore, the switching between each memory block 11 and each latch block 12, 13 can be performed at high speed.

(Write Operation)

Next, the timing of the write operation of the semiconductor memory device according to the first embodiment will be described hereinafter with reference to the drawings.

Figure 3:
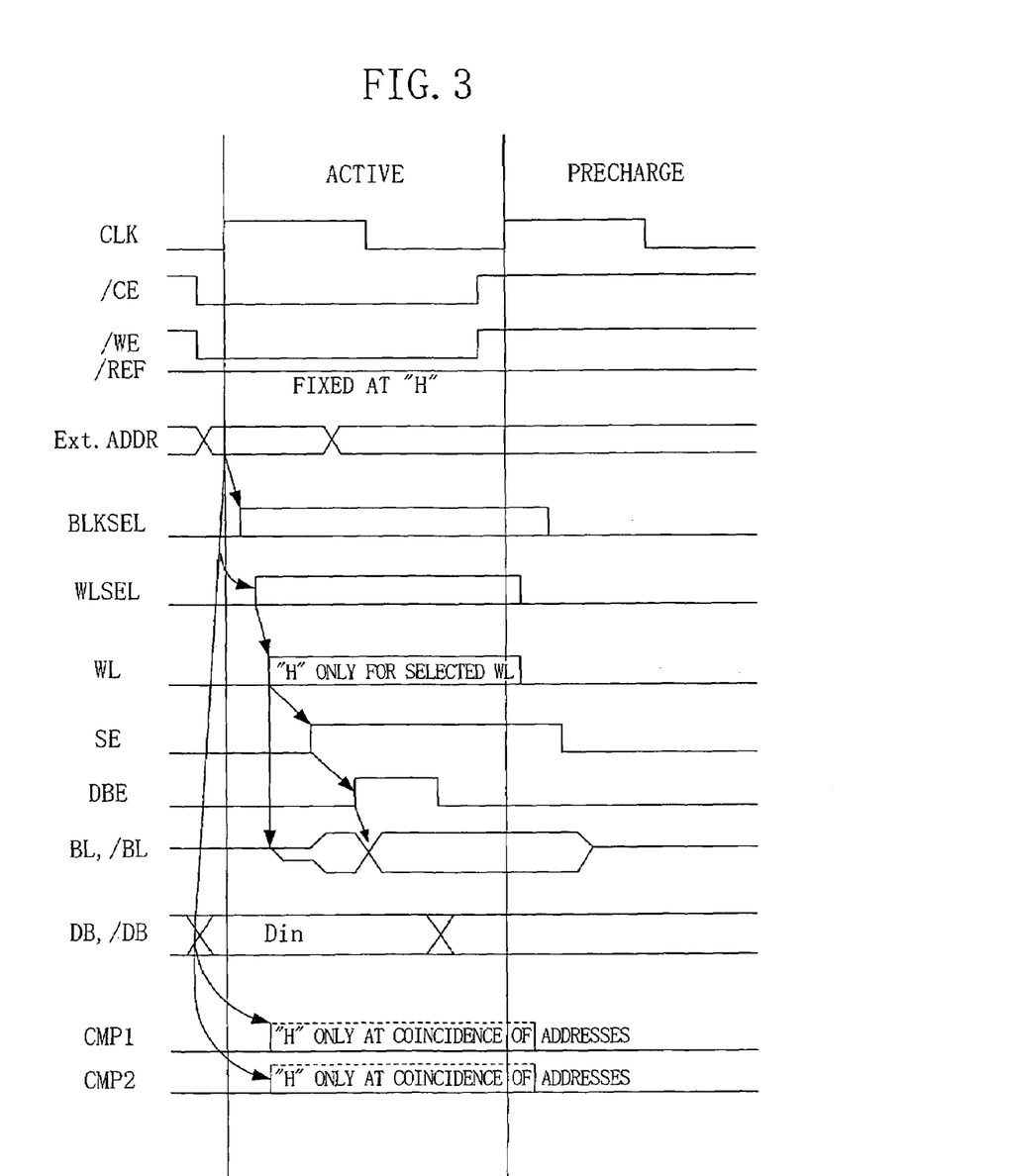
FIG. 3 is a timing diagram showing the timing of a write operation of the semiconductor memory device according to the first embodiment of the present invention.

FIG. 3 is a timing chart during the write operation of the semiconductor memory device.

First, as shown in FIG. 3, the chip enable signal /CE is turned LOW and fed into the control circuit 34. Thus, each memory block 11 and its peripheral circuits become activated. Simultaneously, the write enable signal /WE for enabling the write operation is activated at LOW level. In this case, the refresh signal /REF is fixed to an inactive state at HIGH level.

Thereafter, like the read operation, the decoding of the external address signal Ext.ADDR is started on the rising edge of the clock signal CLK. More particularly, when the predecoder 33 decodes the external address signal Ext.ADDR, the potentials of the block selection signal BLKSEL and word line selection signal WLSEL for the memory cell block 11 corresponding to the external address signal Ext.ADDR are turned HIGH. Thus, the selected word line WL transitions to HIGH level. Simultaneously, the comparators 35A and 35B start comparisons of the external address signal Ext.ADDR to program address signals PRG1 and PRG2, respectively. When a coincidence is obtained as the comparison result, the potential of the first or second repair signal CMP1 and CMP2 rises.

Thereafter, the increased potential of the designated word line WL increases the potential of the sense enable signal SE from the control circuit 34. Since not only the block selection signal BLKSEL but also the sense enable signal SE transition to HIGH level, the corresponding sense amplifier 18 is activated. Furthermore, the increased potential of the designated word line WL allows the selection transistor of the memory cell 17 to be in a low impedance state. This gradually increases the potential difference between the bit line pair BL and /BL connected to the selection transistor.

After the potential of the sense enable signal SE rises to HIGH level, the potential of the data bus line enable signal DBE output from the control circuit 34 also rises. The block selection signal BLKSEL and the repair signals CMP1 and CMP2 have transitioned to a predetermined potential by this stage. Therefore, the selection of the word line WL designated by the external address signal Ext.ADDR or the selection line RT1 or RT2 has completed.

At this time, when the word line WL of the memory block 11 is selected, the switch transistors 16 placed in the memory block 11 turn on. Immediately thereafter, desired data is written through the data input/output buffer 15, the read/write amplifier 14, the common data bus line pair DB and /DB and the bit line pair BL and /BL into the predetermined memory cell 17.

On the other hand, when the first latch block 12 is selected, the switch transistors 16 placed in the first latch block 12 turn on. Immediately thereafter, desired data is written through the data input/output buffer 15, the read/write amplifier 14 and the common data bus line pair DB and /DB into the latch circuit 19.

In this way, the semiconductor memory device of this embodiment carries out, also in the write operation, parallel processing of selection of a word line WL by the predecoder 33 and comparisons of the comparators 35A and 35B for detecting a redundancy repair address specifying a defective word line. Therefore, the switching between each normal memory block 11 and each latch block 12, 13 can be performed at high speed.

(Refresh Operation)

Next, a description will be given of the selection operation of a word line during a data refresh of the semiconductor memory device according to the first embodiment.

During a refresh, a refresh signal /REF activated at LOW level is fed into the control circuit 34. Thus, the control circuit 34 delivers an internal refresh signal /REFE activated at LOW level to the selector 31. The selector 31 selects the internal address signal Int.ADDR output from the refresh address generation circuit 30. The selected internal address signal Int.ADDR is fed through the address latch circuit 32 into the predecoder 33. In this case, the data bus line enable signal DBE output from the control circuit 34 is fixed to an inactive state at LOW level.

Decoding and comparison processings are performed on the internal address signal Int.ADDR, like the external address signal Ext.ADDR during the read/write operation. When the internal address signal Int.ADDR coincides with neither of the program address signals PRG1 and PRG2, the non-repair signal CMPALL is turned HIGH and activated. On the other hand, when the internal address signal Int.ADDR coincides with either of the program address signals PRG1 and PRG2, the non-repair signal CMPALL is turned LOW and inactivated.

The non-repair signal CMPALL is fed into the data bus line connection control circuit 22 of each memory block 11. However, the block selection line BLK is kept at LOW level independently of the potential of the non-repair signal CMPALL, because the data bus line enable signal DBE that is the other input signal is at LOW level. Therefore, each memory block 11 is not electrically connected to the common data bus line pair DB and /DB.

Subsequently, the data read operation and the subsequent write operation are performed for the word line WL designated by the internal address signal Int.ADDR to execute a data refresh.

Also in this case, neither of the first and second selection lines RT1 and RT2 for selecting the first and second latch blocks 12 and 13 is selected, because the data bus line enable signal DBE is inactive as described above.

In this way, the semiconductor memory device according to the first embodiment carries out a refresh operation on the word line WL designated by the internal address signal Int.ADDR regardless of the comparison result between each program address PRG1, PRG2 and the internal address signal Int.ADDR.

By the way, each comparator 35A, 35B can easily be fabricated by combining elements for subjecting a plurality of input address values and the same number of program address values to exclusive OR and AND operations or other operations and such combinations are well known. Therefore, a description thereof is not given.

The refresh address generation circuit 30 can also easily be fabricated using a counter and is also well known. Therefore, a description thereof is not given.

(Embodiment 2)

A second embodiment of the present invention will be described hereinafter with reference to the drawings.

Figure 4:
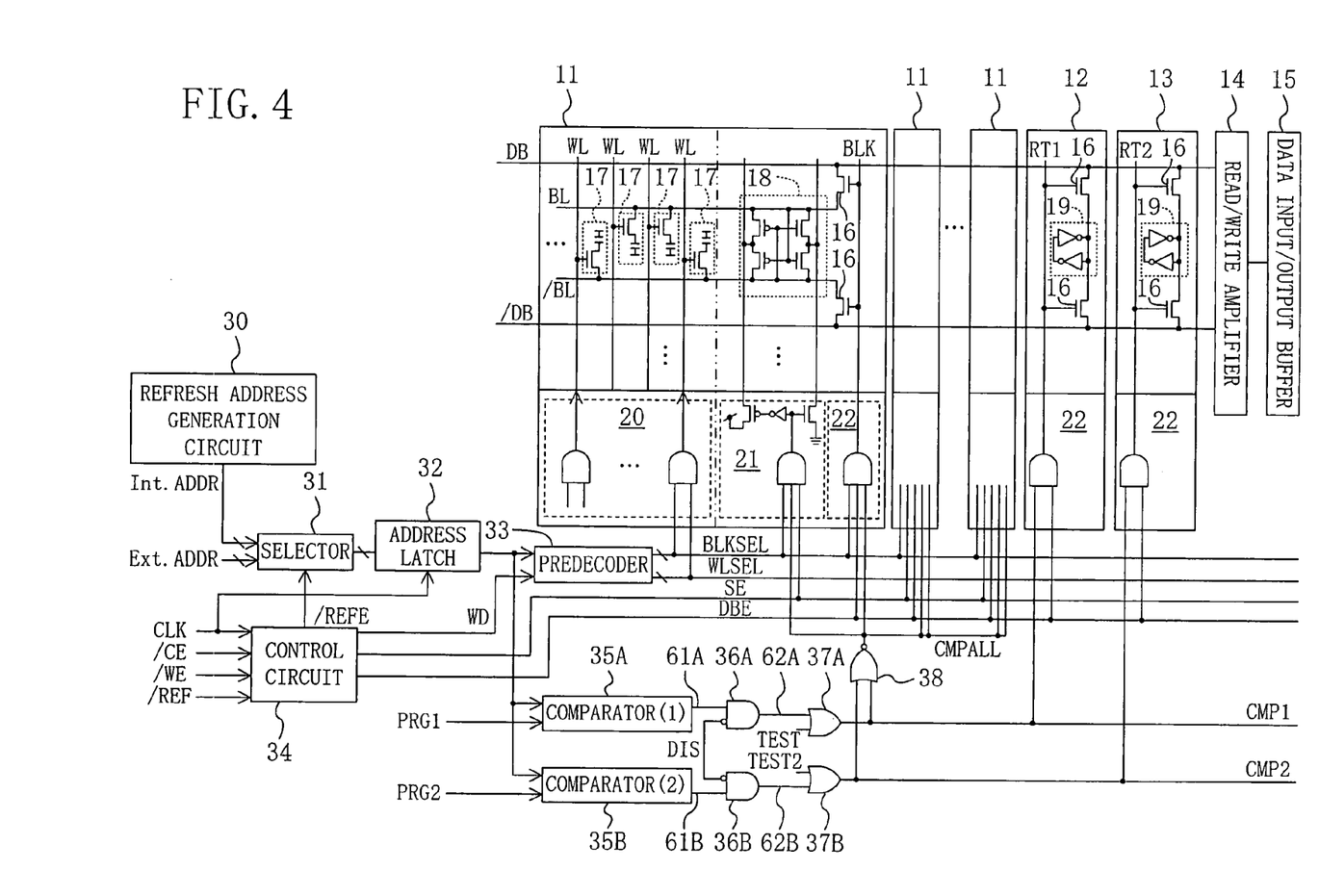
FIG. 4 is a block diagram showing a semiconductor memory device according to a second embodiment of the present invention.

FIG. 4 shows the block structure of a semiconductor memory device according to the second embodiment of the present invention. Referring to FIG. 4, the same numerals are given to the same components as those shown in FIG. 1. Thus, a description thereof is not given, and only differences from the first embodiment will be described.

As shown in FIG. 4, the semiconductor memory device of the second embodiment is configured such that a non-repair signal CMPALL output from a conversion circuit 38 is also fed into a sense amplifier activation control circuit 21 for controlling a sense amplifier 18 provided for each of memory blocks 11.

The first embodiment is configured such that the sense amplifier 18 designated by an external address signal Ext.ADDR or an internal address signal Int.ADDR is activated by a block selection signal BLKSEL and a sense enable signal SE regardless of the values of repair signals CMP1 and CMP2 output from comparators 35A and 35B, respectively.

On the other hand, the sense amplifier 18 of the second embodiment is controlled not only by the values of the block selection signal BLKSEL and the sense enable signal SE but also by the value of a non-repair signal CMPALL that is the comparison result between each program address PRG1, PRG2 and the external address signal Ext.ADDR or the internal address signal Int.ADDR.

More particularly, when the value of the external address signal Ext.ADDR or the internal address signal Int.ADDR does not coincide with the value of each program address PRG1, PRG2, the repair signals CMP1 and CMP2 are both at LOW level. Therefore, the non-repair signal CMPALL output from the conversion circuit 38 is turned HIGH. Hence, like the first embodiment, the sense amplifier 18 of the memory block 11 including the designated word line WL is activated. On the other hand, when the external address signal Ext.ADDR or the internal address signal Int.ADDR coincides with one of the program addresses PRG1 and PRG2, and therefore the corresponding one of the repair signals CMP1 and CMP2 is at HIGH level to perform a redundancy repair, the non-repair signal CMPALL is turned LOW. Therefore, the sense amplifier 18 of the memory block 11 including the designated word line WL is not activated.

As described so far, according to the second embodiment, when the word line WL corresponding to the designated address coincides with the program address PRG1 or PRG2, it becomes possible like the first embodiment to switch from the designated word line WL to a first selection line RT1 in a first latch block 12 or a second selection line RT2 in a second latch block 13.

In addition, when the first or second latch block 12 or 13 is selected, the sense amplifier 18 placed in the memory block 11 is not activated. Therefore, power consumption due to a sensing operation can be reduced even during a refresh.

What is claimed is:

1. A semiconductor memory device comprising:
   a plurality of memory blocks including a plurality of word lines and a plurality of bit line pairs intersecting the individual word lines, a plurality of memory cells provided at each of intersections where the individual word lines intersect the individual bit line pairs, and a plurality of sense amplifiers respectively provided in correspondence with the plurality of bit line pairs;
   a plurality of common data bus line sets each electrically connected via first selection switches to the corresponding memory blocks; and
   at least one latch circuit electrically connected via second selection switches to each of the common data bus line sets,
   wherein switching from a first state to a second state is performed by the first selection switches and the second selection switches,
   each of the common data bus line sets is connected with the corresponding memory blocks in the first state,
   each of the common data bus line sets is connected to at least one latch circuit in the second state, and
   the first selection switches are on and the second selection switches are off in the first state and the first selection switches are off and the second selection switches are on in the second state.

2. The semiconductor memory device of claim 1, wherein the latch circuit is an SRAM circuit.

3. The semiconductor memory device of claim 1, wherein the number of the latch circuits is the same as that of the sense amplifiers activated during one cycle of access to each said memory block.

4. The semiconductor memory device of claim 1, wherein the number of the latch circuits is the same as that of the common data bus line sets.

5. The semiconductor memory device of claim 1, wherein the latch circuit is arranged in the same layout pattern as each said sense amplifier.

6. The semiconductor memory device of claim 1, further comprising
   a read/write amplifier for performing a data read/write operation through the common data bus line sets on the plurality of memory blocks,
   wherein the at least one latch circuit is placed between the memory blocks and the read/write amplifier.

7. The semiconductor memory device of claim 1, wherein the plurality of bit line pairs, the plurality of word lines and the plurality of common data bus line sets have a multilayer interconnect structure consisting of at least three layers.

8. A semiconductor memory device comprising:
   a plurality of memory blocks including a plurality of word lines and a plurality of bit line pairs intersecting the individual word lines, a plurality of memory cells provided at each of intersections where the individual word lines intersect the individual bit line pairs, and a plurality of sense amplifiers respectively provided in correspondence with the plurality of bit line pairs;
   a plurality of common data bus line sets each electrically connected via first selection switches to the corresponding memory blocks;
   at least one latch circuit electrically connected via second selection switches to each of the common data bus line sets; and
   at least one comparator for comparing a value of an externally input external address to a value of a previously programmed program address,
   wherein when the at least one comparator compares, in its activated state, the value of the external address to the value of the program address and both the values coincide with each other, the latch circuit is selected instead of the sense amplifier corresponding to the external address.

9. The semiconductor memory device of claim 8, further comprising
a decoder circuit for decoding the external address in parallel with the comparison of the external address to the program address,
wherein the comparator completes the comparison before the sense amplifier corresponding to the external address or the latch circuit is selected.

10. The semiconductor memory device of claim 8, wherein
the word line designated by the external address in the memory block and the corresponding sense amplifier are activated independently of a comparison result output from the comparator.

11. The semiconductor memory device of claim 8, wherein
the word line designated by the external address in the memory block is activated independently of a comparison result output from the comparator, and the sense amplifier designated by the external address is not activated when the comparison result output from the comparator is true.

12. The semiconductor memory device of claim 8, further comprising:
an internal address generation circuit for generating an internal address for a refresh operation of refreshing data held by the plurality of memory cells; and
a selection circuit for selecting, during a refresh operation, the word line corresponding to a refresh address generated by the internal address generation circuit,
wherein during the refresh operation, the latch circuit is not selected independently of the comparison result between the refresh address and the program address.

13. The semiconductor memory device of claim 12, wherein
when a coincidence is obtained as the comparison result between the refresh address and the program address, the sense amplifier designated by the refresh address in the memory block is not activated.

14. The semiconductor memory device of claim 8, wherein
the program address is programmed by fuse elements.

15. The semiconductor memory device of claim 8, wherein the program address is programmed by nonvolatile memory elements.

16. The semiconductor memory device of claim 8, wherein
when a first switching signal is activated, the sense amplifier corresponding to the external address is not selected independently of the comparison result output from the comparator, and the latch circuit is forcedly selected.

17. The semiconductor memory device of claim 8, wherein
when a second switching signal is activated, the latch circuit is not selected independently of the comparison result output from the comparator, and the sense amplifier corresponding to the external address is forcedly selected.

* * * * *